(12) United States Patent
Kang

(10) Patent No.: US 6,873,537 B2
(45) Date of Patent: *Mar. 29, 2005

(54) FERROELECTRIC MEMORY CELL ARRAY AND DEVICE FOR OPERATING THE SAME

(75) Inventor: Hee-Bok Kang, Daejon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 123 days.

This patent is subject to a terminal disclaimer.

(21) Appl. No.: 10/287,815

(22) Filed: Nov. 5, 2002

(65) Prior Publication Data

US 2003/0103391 A1 Jun. 5, 2003

(30) Foreign Application Priority Data

Nov. 5, 2001 (KR) ...................................... P2001-68651

(51) Int. Cl.[7] .............................................. G11C 11/22
(52) U.S. Cl. ............................ 365/145; 365/63; 365/69
(58) Field of Search .............................. 365/145, 63, 69

(56) References Cited

U.S. PATENT DOCUMENTS 6,072,711 A * 6/2000 Kang ........................... 365/65
6,118,687 A * 9/2000 Kang ........................... 365/145

* cited by examiner

Primary Examiner—Hoai Ho
(74) Attorney, Agent, or Firm—Mayer, Brown, Rowe & Maw LLP

(57) ABSTRACT

A ferroelectric memory cell array and a device for driving the same are disclosed, in which the ferroelectric memory cell array is defined as first and second cell regions each using at least one group of four split wordlines to reduce a layout area of the memory cell array and/or a RC load when a split wordline is used as a plate line. In the first cell region, the first and third split wordlines are used as wordlines, and the second and fourth split wordlines are used as plate lines. In the second cell region, the second and fourth split wordlines are used as wordlines and the first and third split wordlines are used as plate lines.

5 Claims, 7 Drawing Sheets

FERROELECTRIC MEMORY CELL ARRAY AND DEVICE FOR OPERATING THE SAME

This application claims the benefit of the Korean Application No. 2001-68651 filed on Nov. 5, 2001, which is hereby incorporated by reference in its entirety.

BACKGROUND OF THE INVENTION

1. Field of the Invention

The present invention relates to a semiconductor memory, and more particularly, to a ferroelectric memory cell array devised to reduce RC load of a plate line.

2. Discussion of the Related Art

Generally, a nonvolatile ferroelectric memory, such as a ferroelectric random access memory (FRAM), can have a data accessing speed equal to that of a dynamic random access memory (DRAM). In addition, a nonvolatile ferroelectric memory can retain data even when the power is off. For these reasons, the nonvolatile ferroelectric memory has received much attention as a next generation memory device.

The FRAM is a memory device similar in structure to that of the DRAM in that both devices include a capacitor. Unlike the DRAM, the capacitor of an FRAM includes a ferroelectric substance having a high residual polarization characteristic. The residual polarization characteristic permits data to be maintained even after an electric field is removed from a ferroelectric capacitor.

FIG. 1 illustrates a hysteresis loop for a ferroelectric substance. Even after an electric field that induced a polarization has been removed, data is maintained to a certain amount, as shown by points d and a in FIG. 1. The removal of power does not erase data due to the presence of residual polarization or spontaneous polarization that maintains charge in the ferroelectric capacitor. Thus, a nonvolatile ferroelectric memory cell, such as a ferroelectric random access memory that includes cells each having a transistor and a ferroelectric capacitor, can be used as a memory device by corresponding states of charge to "1" and "0", respectively. For example, a ferroelectric capacitor having a charge in a state shown as d in FIG. 1 can be a "1" and a ferroelectric capacitor having a charge in a state shown as a in FIG. 1 can be a "0".

As shown in the circuit diagram of FIG. 2, a related art nonvolatile ferroelectric memory array includes first and second bitlines BL1 and BL2 formed in one direction that cross first and second split wordlines SWL1 and SWL2 formed in a second direction. At the intersection of a pair of the split wordlines and a bit line a memory cell is formed. The memory cell includes a first transistor T1 with a gate connected to the first split wordline SWL1 and a source connected to the first bitline BL1, and a first ferroelectric capacitor FC1 with one terminal connected to a drain of the first transistor T1 and the other terminal connected to the second split wordline SWL2. The nonvolatile ferroelectric memory array, as shown in FIG. 2, further includes a second transistor T2 with a gate connected to the second split wordline SWL2 and a source connected to the second bitline BL2, and a second ferroelectric capacitor FC2 with one terminal connected to a drain of the second transistor T2 and the other terminal connected to the first split wordline SWL1.

FIG. 3 is a timing diagram illustrating data input/output operation of a related art nonvolatile ferroelectric memory array. The period t0 is for precharging all bitlines to a ground level of 0V in response to a high signal. During the period t0, the first and second split wordlines SWL1 and SWL2 are not yet activated to a high state.

Subsequently, in the period t1, both of the first and second split wordlines SWL1 and SWL2 are activated to the high state and thus the voltage level of the bitlines can change. In the instance where the ferroelectric capacitor stores a high state, an electric field is provided from the ferroelectric capacitor having greater potential than the bitlines. Accordingly, a large amount of current flows as ferroelectric polarization changes, and thus high voltage is at the bitlines. In the instance where the ferroelectric capacitor stores a low state, an electric field is provided from the ferroelectric capacitor having about same potential as the bitlines. Accordingly, a small amount of current flows since ferroelectric polarization does not change, and thus a low voltage is at the bitlines.

As shown in the period t2 of FIG. 3, when cell data is transferred to the bitlines, both the first and second split wordlines SWL1 and SWL2 are in the "on" state, a sense amplifier is activated that switches an active signal to a high state to amplify the bitline level. Then, in the period t3, a column switch signal CS goes to a high state such that a switch is activated to connect bitlines and data bus lines to each other. By connecting the bitlines and data bus lines, bitline data can be transmitted to data bus in a read mode and/or data bus data can be transmitted to bitlines for a write mode of a logic state "1" in a cell during the period t3. For example, if the second bitline BL2 is in a high state, a logic "1" state is stored in the ferroelectric capacitor FC2 of the cell because of the electrical potential between the low state of the first split wordline SWL1 and the high state of the second bitline BL2.

In the period t4, the first and second bitline BL1 and BL2 can write a logic '0' into the respective ferroelectric capacitors FC1 and FC2 by making the first split wordline SWL1 be in a high state while transmitting a logic "0" state, such as a low state signal, onto the bitline. On the other hand, if the first and second bitlines BL1 and BL2 are in a high state during period t4, cell data does not change.

Subsequently, in the period t5, the first split wordline SWL1 is switched to a high state and the second split wordline SWL2 is switched to a low state. Accordingly, the first transistor T1 is turned on, and if the first bitline BL1 is in the high state, a high state, such as a logic '1' state, is stored in the ferroelectric capacitor FC1 between the low state of the second split wordline SWL2 and the high state of the first bitline BL1. Lastly, the period t6 is a precharge period to prepare for the next cycle of operation.

In the related art, to operate cells, split wordlines are provided with two types of pulses that are indicative of whether a split wordlines should function as a wordline WL or a plate line. For this reason, the layout area for buses and drivers for wordline and plate line functions are increased. Accordingly, the size of the device itself increases and the speed decreases because of increased distances between components.

SUMMARY OF THE INVENTION

Accordingly, the present invention is directed to a ferroelectric memory cell array and a device for driving the same that substantially obviates one or more problems due to limitations and disadvantages of the related art.

The object of the present invention is to provide a ferroelectric memory cell array devised to reduce RC load of a plate line and a device for driving the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a ferroelectric memory cell array includes first and second bitlines formed in a first direction; first, second, third, and fourth split wordlines formed to cross the first and second bitlines; a first cell region including first and second memory cells; and a second cell region including third and fourth memory cells; wherein the first and third split wordlines are used as gate lines in the first cell region and as plate lines in the second cell region, and the second and fourth split wordlines are used as plate lines in the first cell region and as gate lines in the second cell region.

In another embodiment of the present invention, a ferroelectric memory cell array includes a plurality of bitlines formed in a first direction; a plurality of pairs of split wordlines formed in a second direction to cross the plurality of bitlines; and memory cells formed at an intersection of a bitline and a pair of split wordlines to form a memory cell array; wherein the ferroelectric memory cell array is divided into first and second cell regions on a basis that a split wordline is a gate line for a memory cell or cells in one cell region and a plate line for memory cell or cells in another cell region.

In another embodiment of the present invention, a device for driving a ferroelectric memory cell array includes first and second bitlines formed in a first direction; first, second, third, and fourth split wordlines formed to cross the first and second bitlines; first and second switches operated by a pulse generated from a Wordline (WL) pulse generator for controlling a wordline function of a split wordline; third and fourth switches operated by a pulse generated-from a Plateline (PL) pulse generator for controlling a plate line function of a split wordline; a first detector choosing either the first split wordline or the third split wordline by a WL pulse 'on' signal from the first switch, a PL pulse 'off' signal from the third switch, and a corresponding address signal; and a second detector choosing either the second split wordline or the fourth split wordline by a WL pulse 'off' signal from the second switch, a PL pulse 'on' signal from the fourth switch, and a corresponding address signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention.

DETAILED DESCRIPTION OF THE INVENTION

Reference will now be made in detail to the preferred embodiments of the present invention, examples of which are illustrated in the accompanying drawings. Wherever possible, the same reference numbers-will be used throughout the drawings to refer to the same or like parts.

Figure 1:
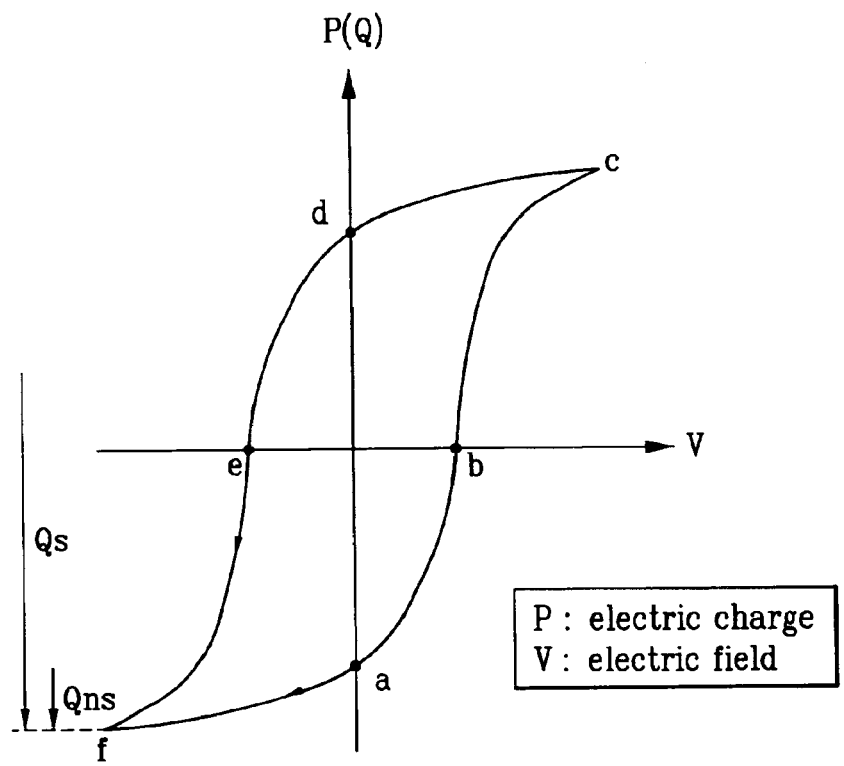
FIG. 1 illustrates a hysteresis loop of a general ferroelectric substance.
Figure 2:
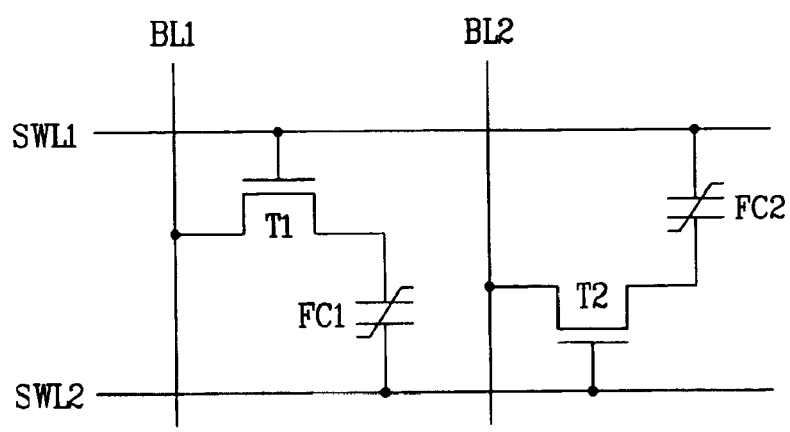
FIG. 2 is a circuit diagram of a related art nonvolatile ferroelectric memory array.
Figure 3:
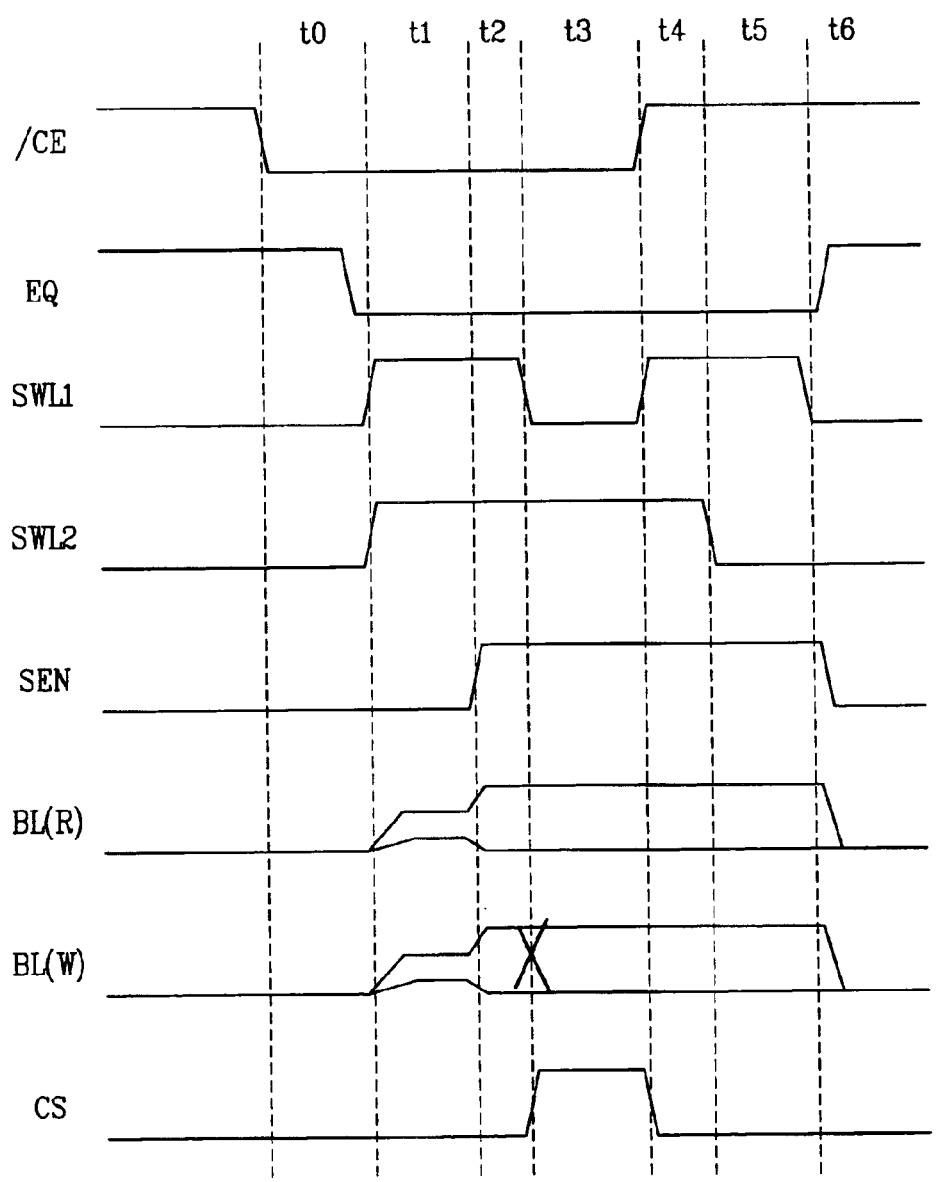
FIG. 3 is a timing diagram illustrating a data input/output operation of a related art nonvolatile ferroelectric memory array.
Figure 4:
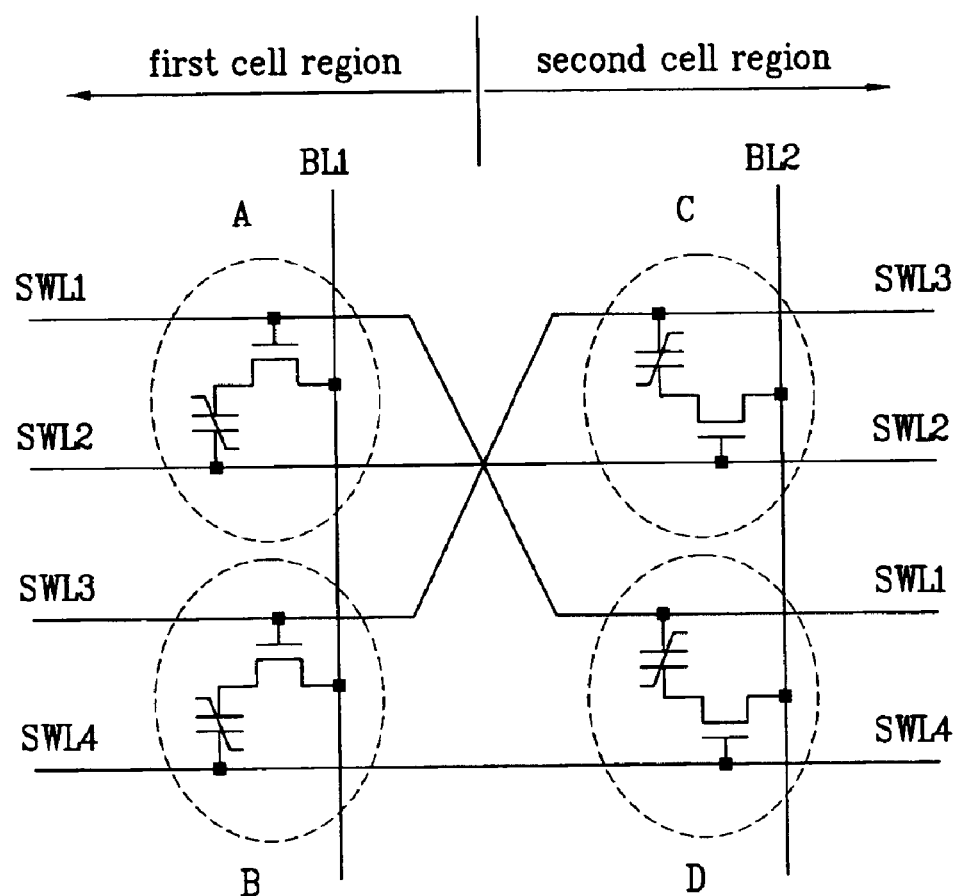
FIG. 4 is a circuit diagram illustrating an exemplary cell array having four split wordlines of a ferroelectric memory device in accordance with the present invention.

FIG. 4 is a circuit diagram illustrating an exemplary memory cell array having four split wordlines in accordance with the present invention. Memory cells A, B, C and D are formed at an intersection of a bitline and a pair of split wordlines, as shown in FIG. 4. The memory cell A includes a transistor T1 with a gate connected to split wordline SWL1 and a source connected to bitline BL1, and a ferroelectric capacitor FC1 with one terminal connected to a drain of the transistor T1 and the other terminal connected to the second split wordline SWL2. Memory cell B includes a transistor T2 with a gate connected to split wordline SWL3 and a source/drain connected to the bitline BL1, and a ferroelectric capacitor FC2 with one terminal connected to a drain/source of the transistor T2 and the other terminal connected to the split wordline SWL4. Memory cell C includes a transistor T3 with a gate connected to split wordline SWL2 and a source/drain connected to bitline BL2, and a ferroelectric capacitor FC3 with one terminal connected to a drain/source of the transistor T3 and the other terminal connected to the split wordline SWL3. Memory cell D includes a transistor T4 with a gate connected to the split wordline SWL4 and a source/drain connected to bitline BL2, and a ferroelectric capacitor FC4 with one terminal connected to a drain/source of the transistor T4 and the other terminal connected to split wordline SWL1. The split wordlines SWL1, SWL2 and SWL3 cross each other between the first and second cell regions.

The ferroelectric memory cell array, as shown in FIG. 4 is divided into cell regions or blocks based on how a split wordline functions with respect to a bitline or bitlines within a cell region as opposed to its function in another cell region. A split wordline that functions as a wordline for a memory cell in one cell region is a plate line for a memory cell in another cell region. As shown in FIG. 4, the split wordlines SWL1 and SWL3 function as wordlines in the first cell region and as plate lines in the second cell region. Further, split wordlines SWL2 and SWL4 function as plate lines in the first cell region and as wordlines in the second cell region.

While memory cells within a first cell region are being used, memory cells within a second cell region are not used since the split wordlines connected to gates for memory cells in the second cell region are being operated as plate lines for the memory cells in the first cell region. On the other hand, while memory cells in the second cell region are being used, memory cells in the first cell region are not in use. Thus, a memory array can be split into two regions or blocks having similar wiring architectures that perform similar functions but the similar functions are performed at different times in each region or block within the memory cell array.

Such a division of a ferroelectric memory cell array localizes the use of a split wordline as a plate line in terms of reading and writing to memory cells. Further, the memory cells within a region of a memory cell array can be configured to have a similar device layout. The localized use of a split wordline as a plate line for memory cells within a memory array reduces RC load losses otherwise caused by distances between memory cells across an entire array along a plate line.

As a plate line load is reduced, the cell effectiveness improves since the block size of a memory cell array can be increased. Reduction in the plate line load can also increase speed with which a memory block can be read or be written to. Further, the layout area of wordline and plate line drivers can be reduced to about half by using wordlines and plate lines as the same lines when two same-sized blocks are provided. Furthermore, since the number of driving bitline columns can be reduced to half in a current sensing structure, the number of signal buses between bitlines and a sense amplifier can also be reduced by half, resulting in smaller bus layout size.

In the memory cell array shown in FIG. 4, the four split wordlines SWL1 to SWL4 perpendicular to first and second bitlines BL1 and BL2 form a group of split wordlines along the direction of the bitlines BL1 and BL2. Additional subsequent groups of split wordlines can also be formed along the direction of the bitlines BL1 and BL2. In addition, groups of split wordlines are not necessarily limited to four split word lines along two bitlines. For example, other configurations of groups of split wordlines can include six split word lines along two bitlines.

In the first cell region as shown in FIG. 4, the first and third split wordlines SWL1 and SWL3 are used as wordlines, and the second and fourth split wordlines SWL2 and SWL4 are used as plate lines. In the second cell region, the second and fourth split wordlines SWL2 and SWL4 are used as wordlines, and first and third split wordlines SWL1 and SWL3 are used as plate lines.

Figure 5A:
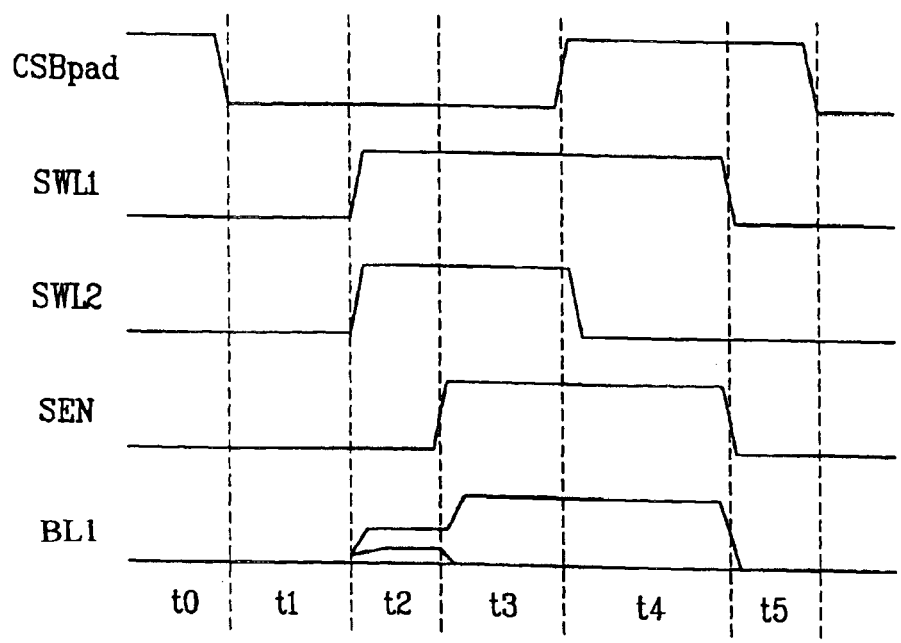
FIGS. 5a and 5b are timing diagrams illustrating an exemplary operation of the memory cells within a first cell region of a ferroelectric memory device in accordance with the present invention.
Figure 5B:
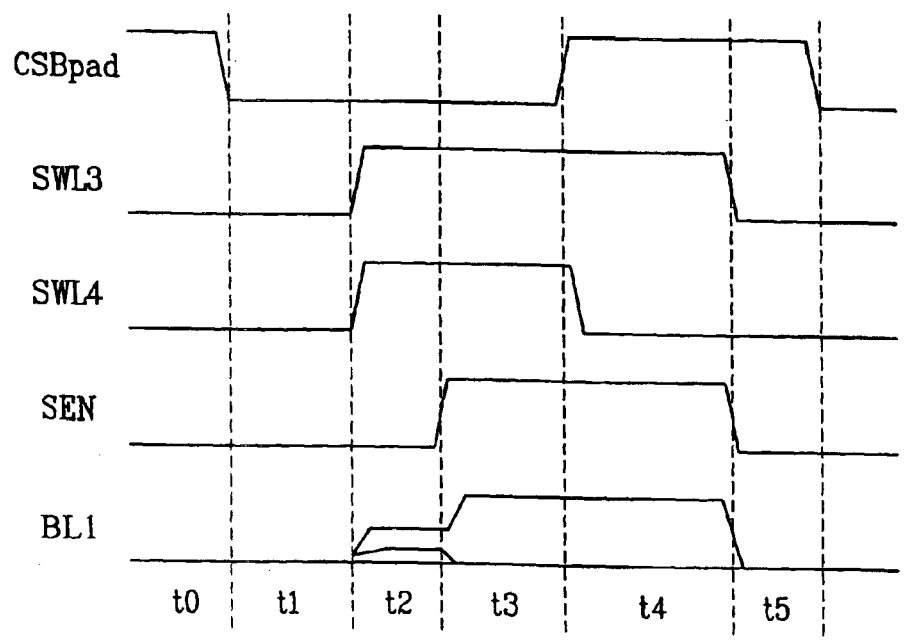

FIGS. 5a and 5b are timing diagrams illustrating an exemplary operation of the memory cells A and B within the first cell region of a ferroelectric memory device shown in FIG. 4. As shown in FIG. 5a for memory cell A of FIG. 4, in the period t2, cell data are induced at the first bitline BL1, as both the first and second split wordlines SWL1 and SWL2 are transited to the high state. The period t3 is a cell low data writing period where a sense amplifier active signal is activated. The period t4 is a cell high data writing period, and the period t5 is a precharge period.

As shown in FIG. 5b for memory cell B of FIG. 4, in the period t2, cell data are induced at the bitline BL1, as both of the third and fourth split wordlines SWL3 and SWL4 are transited to the high state. The period t3 is a cell low data writing period where a sense amplifier is activated. The period t4 is a cell high data writing period, and the period t5 is a precharge period.

Figure 6A:
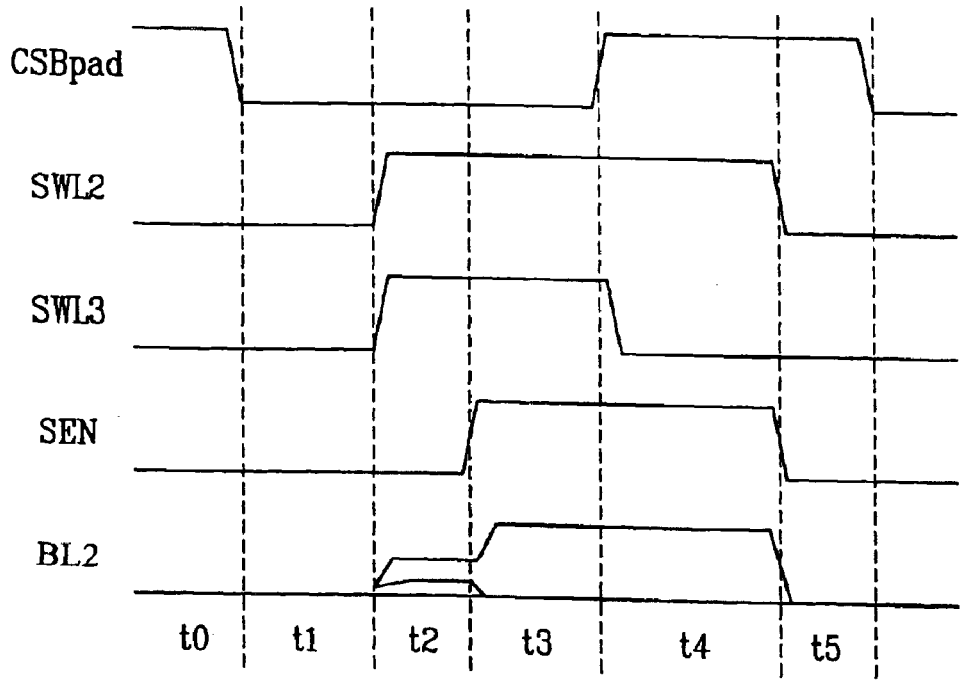
FIGS. 6a and 6b are timing diagrams illustrating an exemplary operation of the memory cells which belong to a second cell region of a ferroelectric memory device in accordance with the present invention.
Figure 6B:
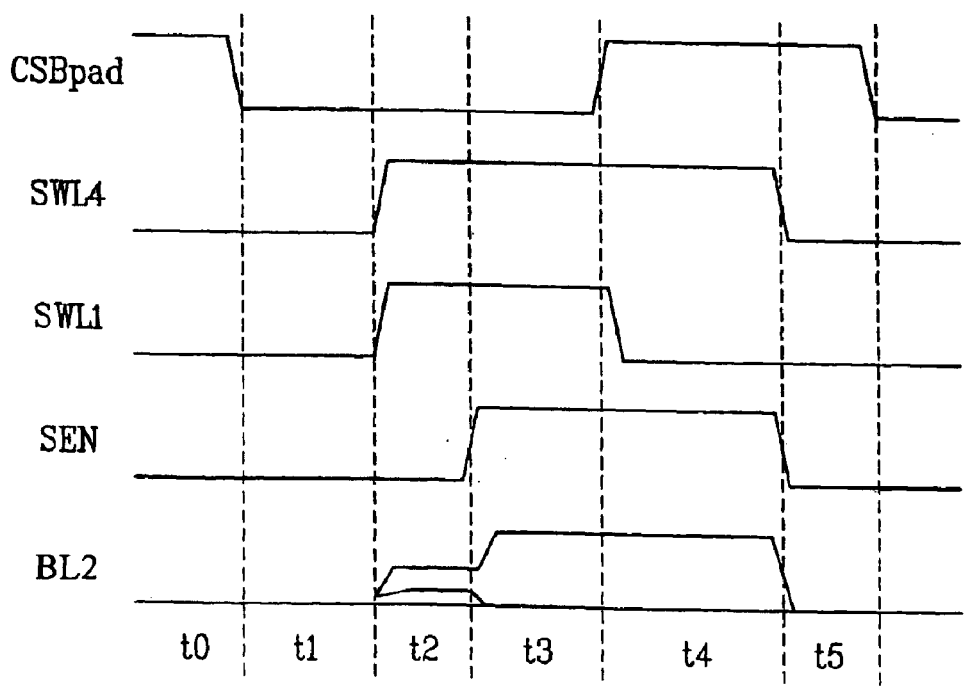

FIGS. 6A and 6B are timing diagrams illustrating an exemplary operation of the memory cells C and D within a second cell region of a ferroelectric memory device shown in FIG. 4. As shown in FIG. 6A, in the period t2, cell data are induced at the bitline BL2, as both of the second and third split wordlines SWL2 and SWL3 are transited to the high state. The period t3 is a cell low data writing period where a sense amplifier is activated. The period t4 is a cell high data writing period, and the period t5 is a precharge period.

As shown in FIG. 6B, in the period t2, cell data are induced at the bitline BL2, as both of the first and fourth split wordlines SWL1 and SWL4 are transited to the high state. The period t3 is a cell low data writing period where a sense amplifier is activated. The period t4 is a cell high data writing period, and the period t5 is a precharge period.

Figure 7A:
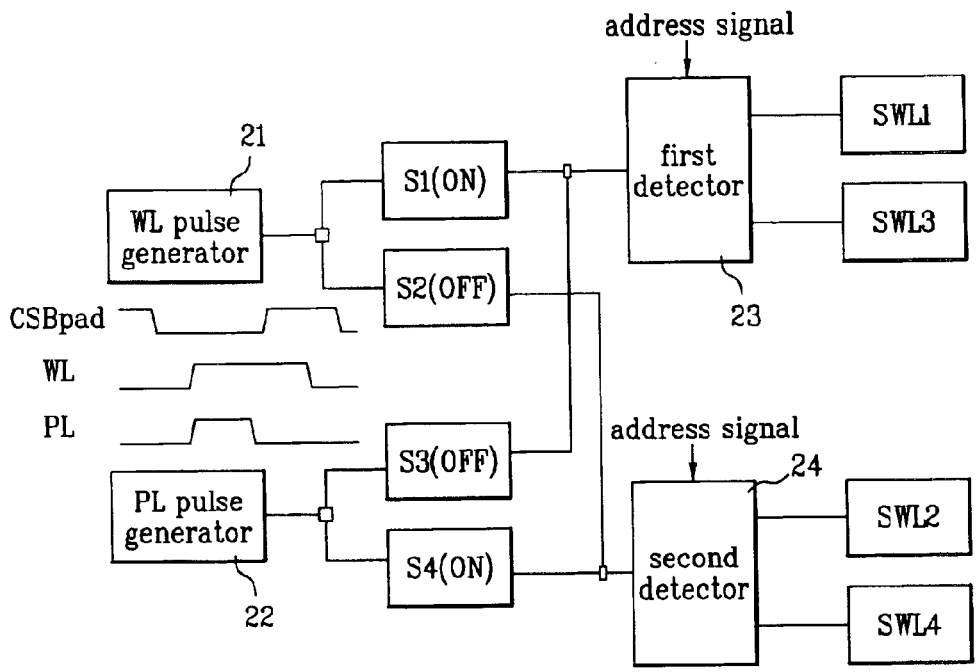
FIGS. 7a and 7b are block diagrams illustrating an exemplary driving device for changing functions of a plurality of split wordlines back and forth from a wordline function to a plate line PL function in a ferroelectric memory cell array in accordance with the present invention.
Figure 7B:
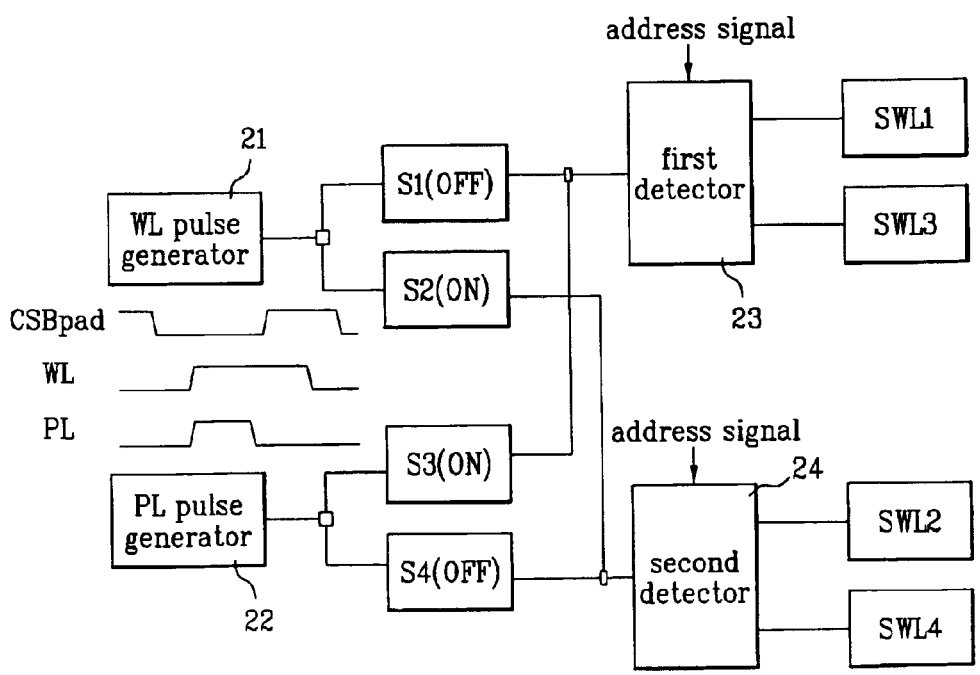

FIGS. 7A and 7B are diagrams illustrating a driving device for changing functions of wordlines WL and plate lines PL of a plurality of split wordlines in a ferroelectric memory device in accordance with the present invention.

FIG. 7A is a block diagram illustrating the operation of an exemplary driving device for a cell data read operation in the first cell region, and FIG. 7B is a block diagram illustrating the operation of an exemplary driving device for a cell data read operation in the second cell region. As shown in FIG. 7A, the device for the cell data read operation in the first region includes first, second, third, and fourth switches S1 to S4 and first and second detectors 23 and 24. The first and second switches S1 and S2 are differentially operated by a pulse generated from a WL pulse generator 21 for controlling a wordline function of a split wordline, and the third and fourth switches S3 and S4 are differentially operated by a pulse generated from a PL pulse generator 22 for controlling a plate line function of a split wordline.

As further shown in FIG. 7A, the first detector 23 chooses either the first split wordline SWL1 or the third split wordline SWL3 in response to a WL pulse 'on' signal from the first switch S1, a PL pulse 'off' signal from the third switch S3, and a corresponding address signal that determines whether split wordline SWL1 or SWL3 is chosen. The second detector 24 chooses either the second split wordline SWL2 or the fourth split wordline SWL 4 in response to a WL pulse 'off' signal from the second switch S2, a PL pulse 'on' signal from the fourth switch S4, and a corresponding address signal that determines whether split wordline SWL1 or SWL3 is chosen.

As shown in FIG. 7B, the device for the cell data read operation in the second region includes first, second, third, and fourth switches S1 to S4, and first and second detectors 23 and 24. The first and second switches S1 and S2 are differentially operated by a pulse generated from a WL pulse generator 21 for controlling a wordline function of a split wordline, and the third and fourth switches S3 and S4 are differentially operated by a pulse generated from a PL pulse generator 22 for controlling a plate line function of a split wordline. The first detector 23 chooses either the first split wordline SWL 1 or the third split wordline SWL 3 in response to a WL pulse 'off' signal from the first switch S1, a PL pulse 'on' signal from the third switch S3, and a corresponding address signal. The second detector 24 chooses either the second split wordline SWL2 or the fourth split wordline SWL 4 in response to a WL pulse 'on' signal from the second switch S2, a PL pulse 'off' signal from the fourth switch S4, and a corresponding address signal.

Figure 8:
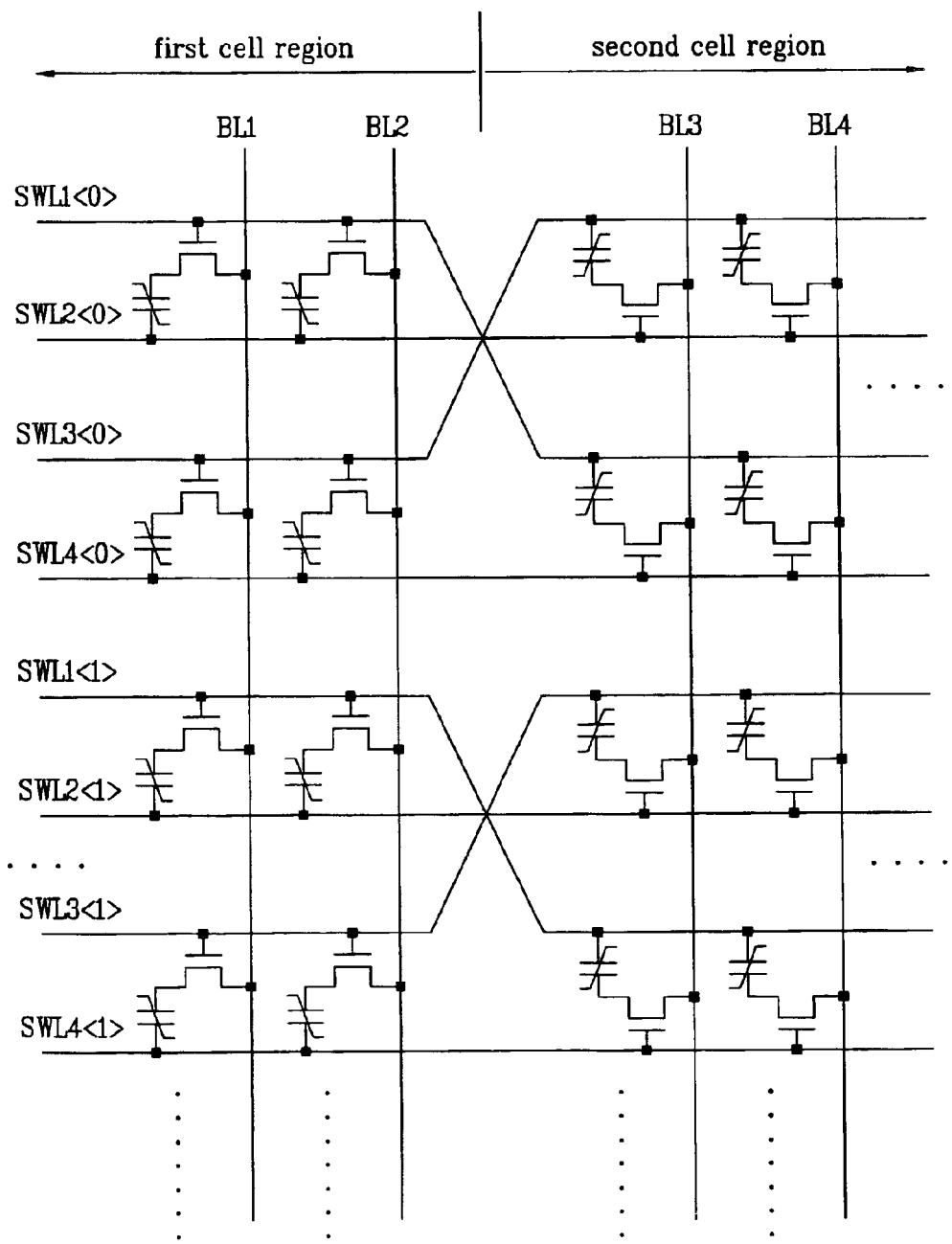
FIG. 8 is a diagram illustrating an exemplary cell array connected to a ferroelectric memory device in accordance with the present invention.

FIG. 8 is a circuit diagram illustrating an exemplary cell array connected to a ferroelectric memory device in accordance with the present invention. A plurality of memory cells can be repeatedly formed within the first and second cell regions having more than one bitline. The ferroelectric memory cell array comprises a plurality of bitlines, such as BL1, BL2, BL3, and BL4 shown in FIG. 8, that are formed in one direction. A plurality of pairs of split wordlines, such as SWL1, SWL2, SWL3, and SWL4 shown in FIG. 8, are formed to cross a bitline. The memory cell array can be divided into a first cell region and a second cell region on the basis of the center of the memory cell array such that each cell contains a half of the memory cells in the memory cell array.

In FIG. 8, every four adjacent split wordlines SLW1<n> to SWL4<n> form a group along the bitlines. In each group of the split wordlines, the first and third split wordlines, such as SWL1<0>, SWL1<1>, SWL3<0>, and SWL3<1>, are used as wordlines in the first cell region and as plate lines in the second cell region. The second and fourth split wordlines, such as SWL2<0>, SWL2<1>, SWL4<0> and SWL4<1>, are used as plate lines in the first cell region and as wordlines in the second cell region.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A ferroelectric memory cell array comprising:

first and second bitlines formed in a first direction;

first, second, third, and fourth split wordlines formed to cross the first and second bitlines;

a first cell region including first and second memory cells; and a second cell region including third and fourth memory cells;

wherein the first and third split wordlines are used as gate lines in the first cell region and as plate lines in the second cell region, and the second and fourth split wordlines are used as plate lines in the first cell region and as gate lines in the second cell region;

wherein the third memory cell includes a third transistor with a gate connected to the second split wordline and one of a source and drain connected to the second bitline; and a third ferroelectric capacitor with one terminal connected to another one of the source and drain of the third transistor and another terminal of the third ferroelectric capacitor connected to the third split wordline.

2. The ferroelectric memory cell array of claim 1, wherein the fourth memory cell includes:

a fourth transistor with a gate connected to the fourth split wordline and one of a source and drain connected to the second bitline; and a fourth ferroelectric capacitor with one terminal connected to another one of the source and drain of the first transistor and another terminal of the fourth ferroelectric capacitor connected to the first split wordline.

3. The ferroelectric memory cell array of claim 1, wherein at least two of the first, second, third and fourth split wordlines cross each other between the first and second cell regions.

4. The ferroelectric memory cell array of claim 1, wherein the first memory cell includes:

a first transistor with a gate connected to the first split wordline and one of a source and drain connected to the first bitline; and a first ferroelectric capacitor with one terminal connected to the another one of the source and drain of the first transistor and another terminal of the first ferroelectric capacitor connected to the second split wordline.

5. A ferroelectric memory cell array of claim 4, wherein the second memory cell includes:

a second transistor with a gate connected to the third split wordline and one of a source and drain connected to the first bitline; and a second ferroelectric capacitor with one terminal connected to another one of the source and drain of the second transistor and another terminal of the second ferroelectric capacitor connected to the fourth split wordline.

* * * * *